United States Patent [19]

Akagawa

[11] Patent Number: 4,856,904
[45] Date of Patent: Aug. 15, 1989

[54] WAFER INSPECTING APPARATUS

[75] Inventor: Masayuki Akagawa, Kawaguchi, Japan

[73] Assignee: Nikon Corporation, Tokyo, Japan

[21] Appl. No.: 157,128

[22] Filed: Feb. 10, 1988

Related U.S. Application Data

[63] Continuation of Ser. No. 819,057, Jan. 15, 1986, abandoned.

[30] Foreign Application Priority Data

| Jan. 21, 1985 | [JP] | Japan | 60-8655 |
| Aug. 9, 1985 | [JP] | Japan | 60-174369 |
| Aug. 9, 1985 | [JP] | Japan | 60-174370 |

[51] Int. Cl.⁴ .......................................... G01B 11/00
[52] U.S. Cl. .................................... 356/400; 250/548; 250/557; 324/158 F; 364/559; 414/222

[58] Field of Search ............... 356/399, 400, 401, 237; 364/492, 551, 559; 324/158 F; 250/491.1, 548, 557; 414/222, 225

[56] References Cited

U.S. PATENT DOCUMENTS

| 4,342,090 | 7/1982 | Caccoma et al. | 364/491 |
| 4,508,453 | 4/1985 | Hara et al. | 356/394 |
| 4,559,603 | 12/1985 | Yoshikawa | 356/394 |
| 4,618,938 | 10/1986 | Sandland et al. | 364/491 |

Primary Examiner—F. L. Evans
Attorney, Agent, or Firm—Shapiro and Shapiro

[57] ABSTRACT

Semiconductor wafer inspecting apparatus comprises plural supports each adapted to support a wafer to be inspected and a feeder for feeding a wafer to each of the plural supports. The apparatus can effect accurate and rapid positioning of the wafer.

14 Claims, 10 Drawing Sheets

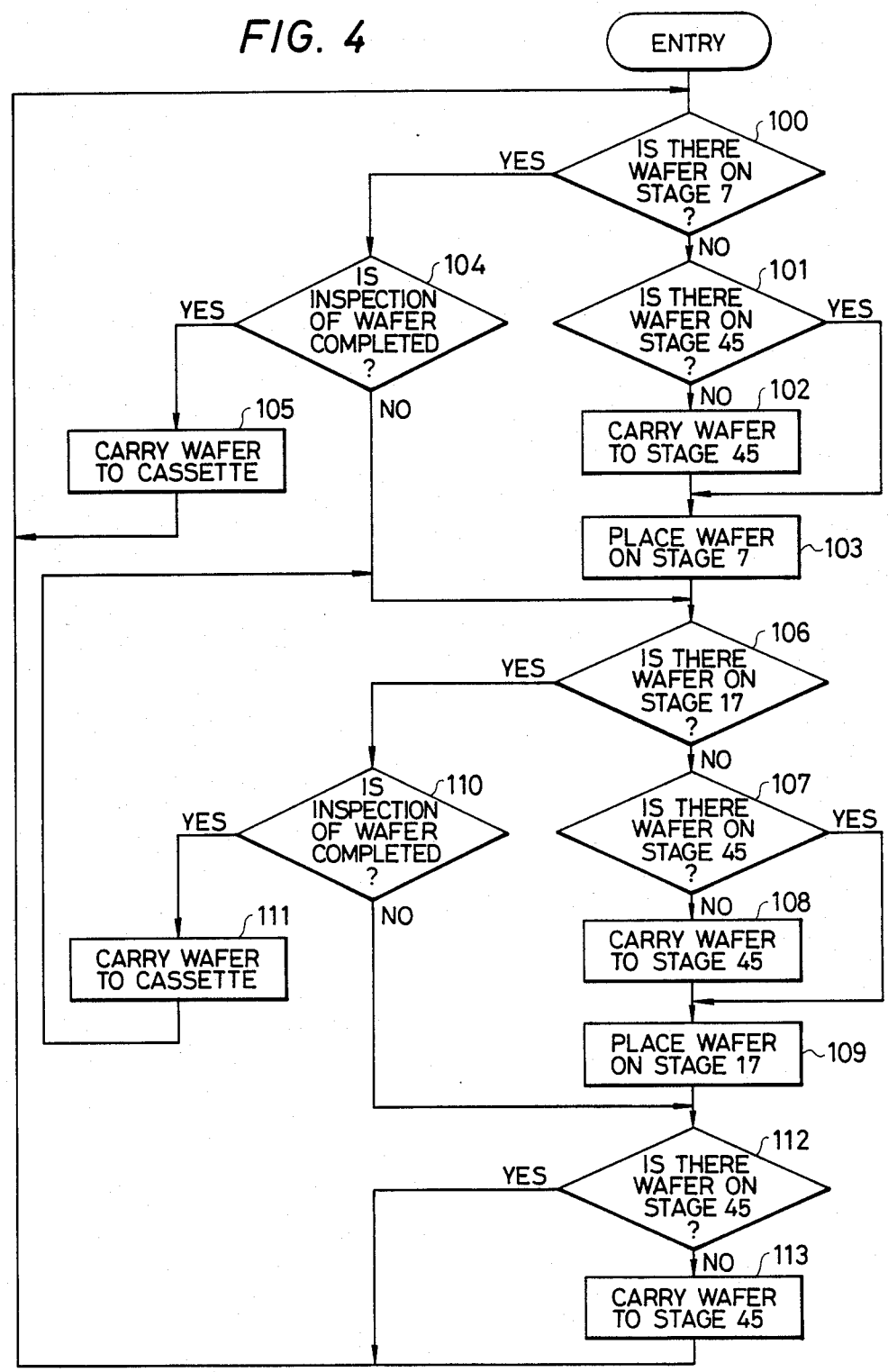

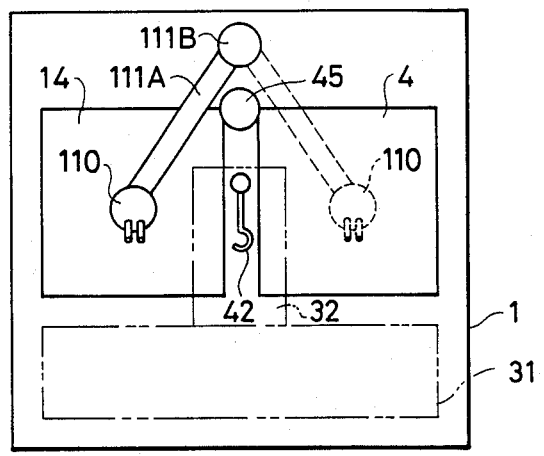
FIG. 5A
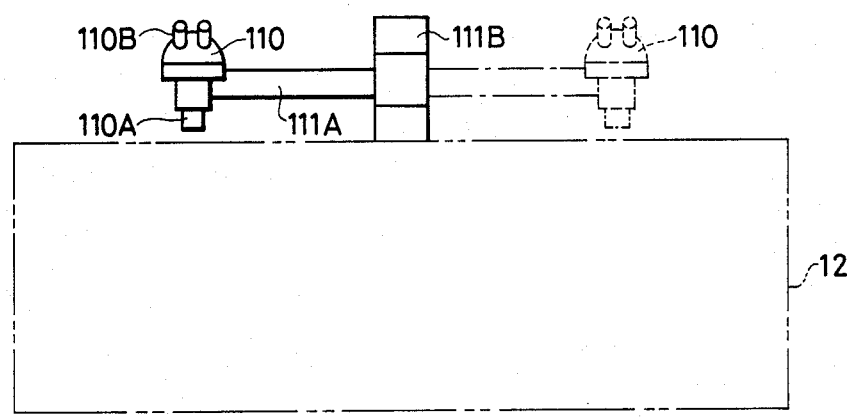
FIG. 5B
FIG. 6B
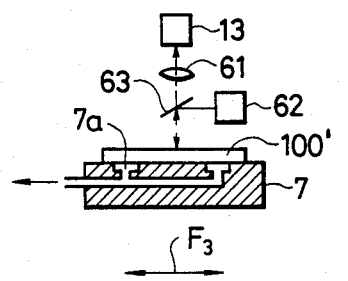
FIG. 6A
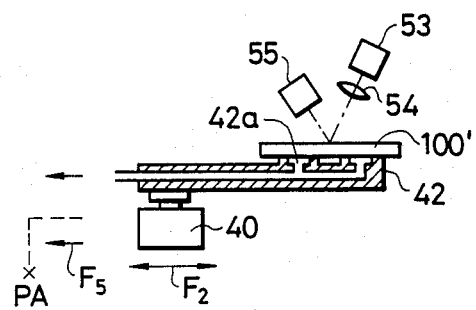

FIG. 19
(A) 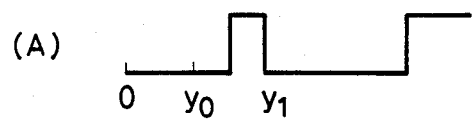
(B) 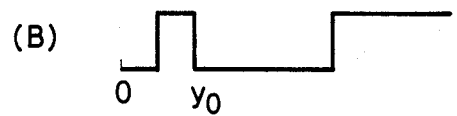
FIG. 20
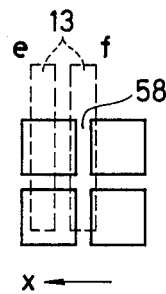
FIG. 21
(A) 
(B) 

WAFER INSPECTING APPARATUS

This is a continuation application of Ser. No. 819,057, filed Jan. 15, 1986, now abandoned.

BACKGROUND OF THE INVENTION

1. Field of the Invention

The present invention relates to a wafer inspecting apparatus for inspecting a semiconductor wafer.

2. pk Description of the Prior Art

It is already known to control two units of a wafer inspecting apparatus with a tester apparatus. However such a system requires a very large floor space for installation, since each wafer inspecting apparatus is equipped not only with a stage mechanism capable of fine alignment for wafer inspection but also with a loading mechanism for bringing the wafer to the stage mechanism.

SUMMARY OF THE INVENTION

An object of the present invention is to provide an automatic wafer aligning apparatus, capable of accurate and rapid positioning of semiconductor wafers.

Another object of the present invention is to provide a wafer inspecting apparatus capable of inspecting semiconductor wafers with plural stage mechanisms and requiring only a small floor space for installation.

BRIEF DESCRIPTION OF THE DRAWINGS

FIG. 4 is a flow chart indicating the control procedure of a microcomputer;

FIGS. 5A and 5B are schematic views showing a partial improvement in the apparatus shown in FIG. 2;

FIG. 6A is a schematic view showing a structure for pre-alignment in the apparatus of the present invention;

FIG. 6B is a schematic view showing a structure for fine alignment in the apparatus of the present invention;

FIG. 19 is a chart showing the wave form of an output signal of a line sensor positioned on an end street shown in FIG. 18;

FIG. 20 is a chart showing a principle of original point location in the alignment on the x-axis;

FIG. 21 is a chart showing the wave form of an output signal of a line sensor positioned on a street shown in FIG. 20.

DETAILED DESCRIPTION OF THE PREFERRED EMBODIMENTS

Now the present invention will be clarified in detail by an embodiment thereof shown in the attached drawings.

Figure 1:
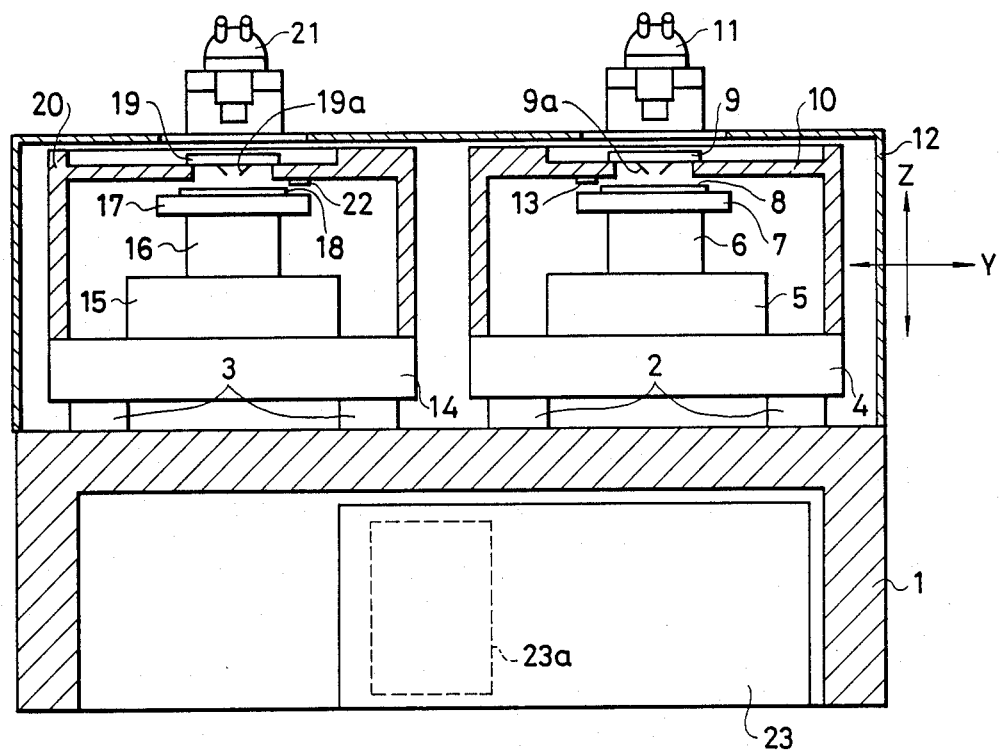
FIG. 1 is a partial view of a wafer inspecting apparatus.

In FIG. 1 there are shown a support frame 1 and vibration preventing mechanisms 2, 3 independently provided on the support frame 1. On the vibration preventing mechanism 2 there is fixed a base 4, on which is provided an X-Y stage 5 for movement in X- and Y-directions on the base 4. On the X-Y stage 5 there is provided a Z-stage 6 for movement in the Z-direction. A $\theta$-rotation stage 7 is provided on the Z-stage 6 to achieve rotational movement thereon. These stages (X-Y, Z, $\theta$) are respectively driven by motors. A wafer 8 is placed on the $\theta$-rotation stage 7, which is equipped with a suction mechanism to support the wafer thereon by vacuum suction. A probe card 9 is fixed on a support 10 extended from the base 4. A microscope 11 is fixed on a casing 12 for observing the wafer 8 placed on the stage 7. A CCD linear sensor 13 scans the wafer 8 for aligning the same. An IC chip formed on the wafer 8 is brought into contact with probe needles 9a by vertical movement of the Z-stage 6. The signals obtained from probe needles 9a are supplied, through the probe card 9, to a tester separate from the wafer inspecting apparatus, and an inspection output concerning the wafer 8 is obtained from the tester. Naturally the tester may be integrally constructed with the wafer inspecting apparatus. In the present embodiment, a right-hand inspection unit is composed of the above-explained components 4–7, 9–11 and 13. A left-hand inspection unit is composed of a base 14, an X-Y stage 15, a Z-stage 16, a $\theta$-rotation stage 17, a probe card 19, a support 20, a microscope 21 and a sensor 22 which are respectively the same as the components 4–7, 9–11 and 13 of the right-hand inspection unit. A wafer 18 is placed on the $\theta$-rotation stage. The right-hand inspection unit and the left-hand inspection unit are respectively supported by the vibration preventing mechanism 2, 3 independently provided on the support frame 1, and these mechanisms prevent mutual transmission of vibration. A control unit 23 is provided with a microcomputer (MCU) 23a provided with a calculating unit, memories, an I/O port etc. and controls the stages 5–7, 15–17, a wafer carrier transport mechanism, and a wafer loading mechanism to be explained later.

In the following there will be explained the wafer carrier transport mechanism and the wafer loading mechanism. These mechanisms are respectively housed in 31 and 32 shown in FIG. 2. Wafer cassettes 33a, 33b, each containing plural wafers are transported by a transport mechanism (not shown) in succession to a position B. The cassette 33a brought to the position B is supported on a table 34a shown in FIG. 3 and is elevated to a broken-line position by an elevator 34. A motor 35 shown in FIG. 3 vertically drives the table 34a of the elevator 34. The elevator 34 and the motor 35 constitute a part of the above-mentioned transport mechanism. A support member 36 fixed on the support frame 1 is provided with a guide member 37 and a worm 38 which is driven by a motor 39. A motor 40 is provided with a worm gear (not shown) meshing with worm 38, and moves to the left or to the right along the X-direction in FIG. 3 by the forward or reverse rotation of the motor 39, along the guide member 37. The motor 40 is provided with a shaft 41 to which an arm 42 is attached. The arm 42 is rotated clockwise or anticlockwise about the shaft 41 in FIG. 2, by the forward or reverse rotation of the motor 40. In the present embodiment the wafer loading mechanism is composed of the above-mentioned components 36–42. A support member 43 is fixed on the support frame 1 and supports a motor 44 which rotates a stage 45 for prealignment of the wafer.

Now reference is made to FIG. 4 for explaining the function of the apparatus of the present invention.

Figure 2:
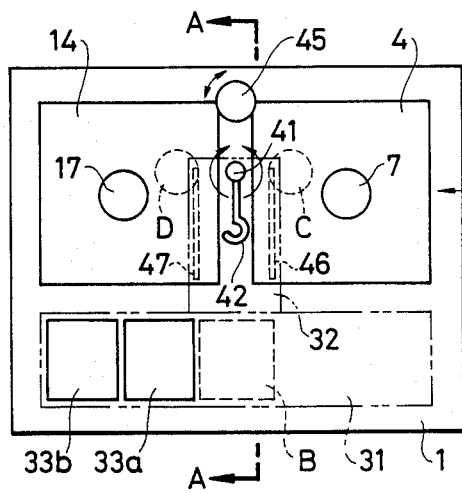
FIG. 2 is a partial view thereof.
Figure 3:
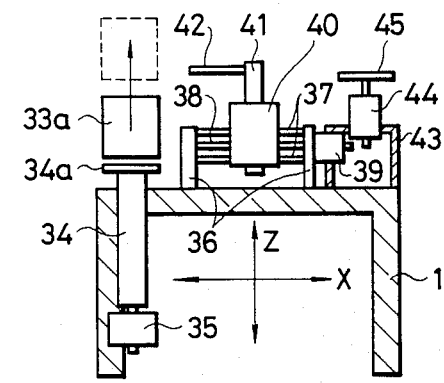
FIG. 3 is a cross-sectional view, along a line A—A shown in FIG. 2, indicating a loading mechanism of the wafer inspecting apparatus.

At first, in response to an instruction from the MCU 23a in the control unit 23, the transport mechanism brings the cassettes 33a, 33b in succession to the position B, and the cassette brought to position B is elevated to the broken-line position shown in FIG. 3 by the elevator 34. In step 100 the MCU 23a identifies if a wafer is present on the $\theta$-rotation stage 7. If not, step 101 identifies whether a wafer is present on the prealignment stage 45. If absent again, step 102 outputs an instruction to bring a wafer to pre-alignment stage 45. Then the loading mechanism and the prealignment stage function in the following manner according to a subroutine of the MCU 23a. At first the motor 39 is activated in the forward direction to shift the motor 40 to the left in FIG. 3, whereupon a wafer contained in the cassette 33a is placed on the arm 42. Then the motor 39 rotates in the reverse direction, thereby shifting the motor 40 and the arm 42 to the right. The motor 40 is then stopped at a suitable position, and is activated to rotate the arm 42 by 180° about the shaft 41. In this manner the wafer is brought to the position of the pre-alignment stage 45 and is placed thereon. Subsequently the motor 40 is shifted to the left by the rotation of the motor 39 and returns to the position shown in FIGS. 2 and 3. However the arm 42 remains directed toward the stage 45. The stage 45, supporting the wafer, effects pre-alignment by rotation. Upon completion of the wafer prealignment, the MCU 23a outputs an instruction, in step 103, to set the wafer on the $\theta$-rotation stage 7. In case step 101 identifies the presence of a wafer on the stage 45, and if the pre-alignment is already completed, the program proceeds directly to step 103. On the other hand, in case step 101 identifies the presence of a wafer on the stage 45 but the pre-alignment is not yet completed, the pre-alignment is continued, and, upon completion thereof, the program proceeds to step 103. In response to the instruction in step 103, the loading mechanism and the fine alignment stages (X-Y, Z and $\theta$-stages 5–7) function in the following manner according to a subroutine of the MCU 23a. At first the motor 39 is rotated in the reverse direction to shift the motor 40 to the right, together with the arm 42 directed toward the pre-alignment stage 45. After the pre-aligned wafer is placed on the arm 42, the motor 39 is rotated in the forward direction to shift the motor 40 to the left in FIG. 3.

Thus the motor 40 returns to the position shown in FIGS. 2 and 3. Then the motor 40 is rotated in the forward direction to rotate the arm 42 clockwise, in FIG. 2, by 90°, thereby bringing the wafer to a position C. At the same time the X-Y stage 5 is driven by a motor (not shown) to bring the $\theta$-rotation stage 7 also to the position C. In this manner the wafer is placed on the $\theta$-rotation stage 7, which fixes the wafer by suction. Subsequently the motor 40 is rotated in the forward direction to rotate the arm 42 by 90° clockwise, thus bringing it to the state shown in FIG. 2. Also the $\theta$-rotation stage 7 returns to the position shown in FIGS. 1 and 2 by the movement of the X-Y stage 5. Then the MCU 23a drives the X-Y stage in the X- and Y-directions, illuminates the wafer with an illuminating optical system (not shown) and receives reflected light from the wafer with the sensor 13, thereby obtaining information on the position of chips formed on the wafer. Based on this information, the MCU 23a finely moves the stages 5–7 to achieve fine alignment of the wafer. The wafer 8 shown in FIG. 1 shows a state after such alignment. Upon completion of the fine alignment of the wafer 8, the MCU 23a supplies a signal to the tester, and simultaneously drives the Z-stage 6 with a motor (not shown) to elevate the $\theta$-rotation stage 7. In this manner the chip formed on the wafer 8 is brought into contact with the probe needles 9a and is inspected by the tester. Upon completion of the chip inspection, the MCU 23a outputs a signal to drive the Z-stage 6, thereby lowering the $\theta$-rotation stage 7. Then the X-Y stage 5 is moved by one chip, and the $\theta$-rotation stage 7 is elevated to bring the next chip into contact with the probe needles 9a for inspection by the tester. Plural chips formed on the wafer 8 are inspected by repeating the above-explained procedure. After outputting the wafer setting instruction in step 103, the MCU 23a immediately proceeds to step 106 to identify whether a wafer is present on the $\theta$-rotation stage 17, without awaiting the completion of the above-explained wafer inspection. Consequently the above-explained procedure of wafer setting, fine alignment and wafer inspection is conducted simultaneously with discrimination step 106 and ensuing steps. In case step 100 identifies the presence of a wafer on the $\theta$-rotation stage 7, the MCU 23a identifies, in step 104, whether the wafer on stage 7 is already inspected. If not, the MCU 23a continues the wafer setting on the stage 7, fine alignment of the wafer and wafer inspection, and immediately moves to step 106, without awaiting the completion of wafer inspection. In this manner the procedure of wafer setting, fine alignment and wafer inspection is conducted simultaneously with discrimination step 106 and the ensuing steps. On the other hand, if step 104 identifies the completion of wafer inspection, the MCU 23a outputs an instruction, in step 105, to return the wafer from the $\theta$-rotation stage 7 to the carrier 33a. In response the loading mechanism and the fine alignment stage function in the following manner, according to a subroutine of the MCU 23a. At first the motor 40 is activated in the reverse direction to rotate the arm 42 by 90° anticlockwise from the position shown in FIG. 2. Simultaneously the X-Y stage 5 is activated to shift the $\theta$-rotation stage 7 to the position C. Then the vacuum suction is terminated and the wafer 8 is placed on the arm 42. Subsequently the stage 7 is shifted to a position shown in FIG. 2. However stage 7 may remain at the position C until the next wafer arrives. After the wafer 8 is placed on the arm 42, the motor 40 is activated in the forward direction to rotate the arm 42 by 90° clockwise in FIG. 2, thus returning arm 42 to the position shown in FIG. 2. Subsequently the motor 39 is activated in the forward direction to shift the motor 40 to the left, thereby returning the wafer into the wafer cassette 33a. Then the motor 40 returns to the position shown in FIG. 3, by the rotation of the motor 39. After return of the motor 40, the MCU 23a returns to step 100. When the MCU 23a proceeds from step 103 or 104 to step 106, there is identified whether a wafer is present on the θ-rotation stage 17. If absent, step 107 identifies whether a wafer is present on the pre-alignment stage 45. If absent again, step 108 outputs an instruction to bring a wafer to pre-alignment stage 45. Thus a wafer is brought from the cassette 33a to the pre-alignment stage 45 in the same manner as in step 102, thereby conducting pre-alignment of the wafer. Upon completion of pre-alignment, step 109 releases an instruction to set the wafer on the θ-rotation stage 17. On the other hand, in case step 107 identifies the presence of a wafer on the stage 45, there is thereafter conducted a procedure the same as that when the presence of a wafer is identified in step 101. In response to the instruction in step 109, the MCU 23a controls the loading mechanism and the stages 15-17 according to a subroutine, in the same manner as the wafer setting from the stage 45 to the stage 7, fine alignment of the wafer and wafer inspection in step 103. However the control in step 109 is different from that in step 103 in the rotating direction of the arm 42, in that the stages 15-17 are activated instead of the stages 5-7, in that the stage 17 is brought to a position θ at the wafer setting thereon, and in that the wafer on the stage 17 is inspected by the probe needles 19a.

In this manner the wafer is set on the stage 17, then subjected to fine alignment and inspected. The wafer inspection is conducted with the same tester mentioned before. After outputting the wafer setting instruction in step 109, the MCU 23a immediately moves to step 112 to identify whether a wafer is present on the pre-alignment stage 45, without awaiting the completion of wafer inspection. Consequently as in the aforementioned steps 103 and 106, the procedure of the wafer setting, fine alignment of the wafer and wafer inspection is conducted simultaneously with the discrimination step 112 and ensuing steps. On the other hand, in case the presence of a wafer on the prealignment stage 45 is identified in step 106, the MCU 23a identifies, in step 110, whether the wafer on the θ-rotation stage 17 is already inspected. If not, the MCU 23a continues the wafer setting on the stage 17, fine alignment thereof and wafer inspection, and immediately proceeds to step 112 without awaiting the completion of wafer inspection. Thus, as in the aforementioned steps 104 and 106, the procedure of wafer setting, fine alignment and wafer inspection is conducted simultaneously with the discrimination step 112 and ensuing steps. If step 110 identifies the completion of wafer inspection, the MCU 23a outputs, in step 111, an instruction to return the wafer from the stage 17 to the cassette 33a. In response the loading mechanism and the fine alignment stages 15-17 function according to a subroutine of the MCU 23a, whereby the wafer 18 on the stage 17 is returned to the cassette 33a in the same manner as in step 105 and the state shown in FIGS. 2 and 3 is restored. However the above-mentioned procedure is different from that of the step 105 in rotating direction of the arm 42, in that the stages 15-17 are activated and in that the stage 17 is brought to a position D. When the loading mechanism is returned to the state shown in FIGS. 2 and 3, the MCU 23a returns to step 106. The MCU 23a, upon proceeding from step 109 or 110 to step 112, identifies whether a wafer is present on the pre-alignment stage 45, and, if absent, outputs an instruction in step 113 to transfer a wafer to stage 45. Then, according to a subroutine of the MCU 23a, in the same manner as in steps 102 and 108, a wafer stored in the cassette 33a is brought to the pre-alignment stage 45 and is subjected to pre-alignment. Upon completion of the wafer pre-alignment, the MCU 23a returns to step 100. The procedure in case step 112 identifies the presence of a wafer on the stage 45 is the same as when the presence of a wafer on the stage 45 is identified in step 101 or 107. Upon completion of the pre-alignment, the MCU 23a returns to step 100.

In the present embodiment, if the loading mechanism receives a second instruction while it is operated under a first instruction, for example the instructions in steps 103 and 111, the loading mechanism executes the second instruction after the operation according to the first instruction is completed. However the time from the wafer setting on the θ-rotation stage 7 or 17 to the completion of wafer inspection is much longer than the functioning time of the loading mechanism. Consequently it is not expected that the loading mechanism will receive two instructions at the same time as mentioned above.

In the present embodiment, the discrimination in step 100, 101, 104, 106, 107, 110 or 112 is achieved by the MCU 23a itself through identification of the control status of the loading mechanism, pre-alignment stage, fine alignment stage etc. according to the flow chart shown in FIG. 4. For example the discrimination of step 100 is achieved in the following manner. The MCU 23a identifies that the θ-rotation stage does not have a wafer, if the arm 42 has completed an operation of receiving the wafer from the stage 7 and if a wafer supply operation from arm 42 to the stage 7 has not been conducted.

The motors 35, 39, 40, 44 and the motors (not shown) for driving the stages 5-7, 15-17 are driven by signals supplied from the MCU 23a through drivers (not shown).

The wafer cassette is removed by the transport mechanism, when the wafer inspection is completed for all the wafers contained in a cassette, and a new wafer cassette is brought to the position B. Thereafter the above-explained stages of loading, pre-alignment, wafer setting, fine alignment and wafer inspection are repeated.

In the present embodiment, as explained in the foregoing, it is possible to load and inspect a wafer in an inspection unit (steps 106-109 or 100-103) while another wafer is inspected in the other inspection unit (step 103 or 109).

In the foregoing description, the program is designed to proceed from step 105 to 100 and from step 111 to 106, but it may also be designed to proceed from step 105 to 112 and from step 11 to 112.

In addition, electromagnetic shield members 46, 47 may be provided as indicated with broken lines in FIG. 2, in order to reduce the influence to an inspection unit of electromagnetic noise generated in the other inspection unit. The use of such shield members is desirable, therefore, in case considerable electromagnetic influence is anticipated between the inspection units.

An apparatus shown in FIGS. 5A and 5B is provided with a distribution mechanism with an arm 111A rotatable about a shaft 111B, and a microscope 110 is provided at the end of arm 111A as observing means. The microscope 110 is rotatable, with respect to the end of the arm 111A, about the optical axis of an objective lens 110A which is parallel to the above-mentioned shaft 111B, so that the eyepiece 110B of the microscope 110 can be directed to the front side of the apparatus regardless of the rotational position of the arm 111A.

Stated differently, the microscope 110 can revolve both around the shaft 111B and on the optical axis of the objective lens 110A. Except as explained above, the structure of the apparatus is identical with that of the apparatus shown in FIGS. 1, 2 and 3.

When a chip formed on the wafer 8 is brought into contact with the probe needles 9a by the elevation of the θ-rotation stage, the operator moves the microscope 110 to the broken-line position in FIG. 5A to observe the contact state of the chip and the probe needles 9a. On the other hand, at the inspection of the chip formed on the wafer 8, the microscope 110 is brought to the full-line position.

As shown in FIG. 6A, the arm 42 for extracting the wafer 100' from the wafer cassette is provided at the front end thereof with a vacuum chuck 42a for fixing the wafer by suction.

At a suitable position above arm 42, there are provided a CCD line sensor 53 in which photodiodes are arranged in the Y-direction, an optical system 54 and a light source 55. The light emitted by the light source 55 is reflected by the wafer 100', and is focused onto the line sensor 53 by the optical system 54, whereby the pattern on the wafer 100 can be captured as a linear image. Thus, the surface of the wafer 100' is scanned by a movement of the wafer 100' in the direction of arrow F2 parallel to the X-axis, and corresponding image signals are produced from the line sensor 53.

Also as shown in FIG. 6B, the stage 7 is provided with a vacuum check 7a for fixing the wafer by suction.

Above stage 7 there are provided a CCD line sensor 13 in which photodiodes are arranged in the Y-direction, an optical system 61, a light source 62 and a half mirror 63, whereby the light emitted from the light source 62 passes through the half mirror 63, is then reflected by the wafer 100' and enters the line sensor 13 through the half mirror 63 and the optical system 61. An arrow F3 is parallel to the X-axis.

Figure 7:
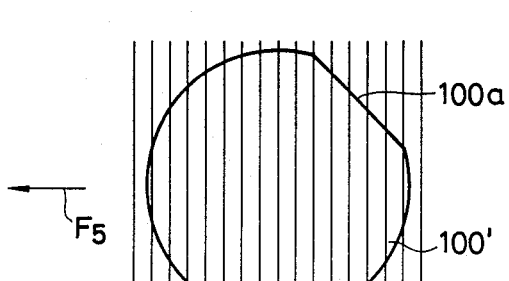
FIG. 7 is a schematic view showing the principle of scanning at image taking.
Figure 11:
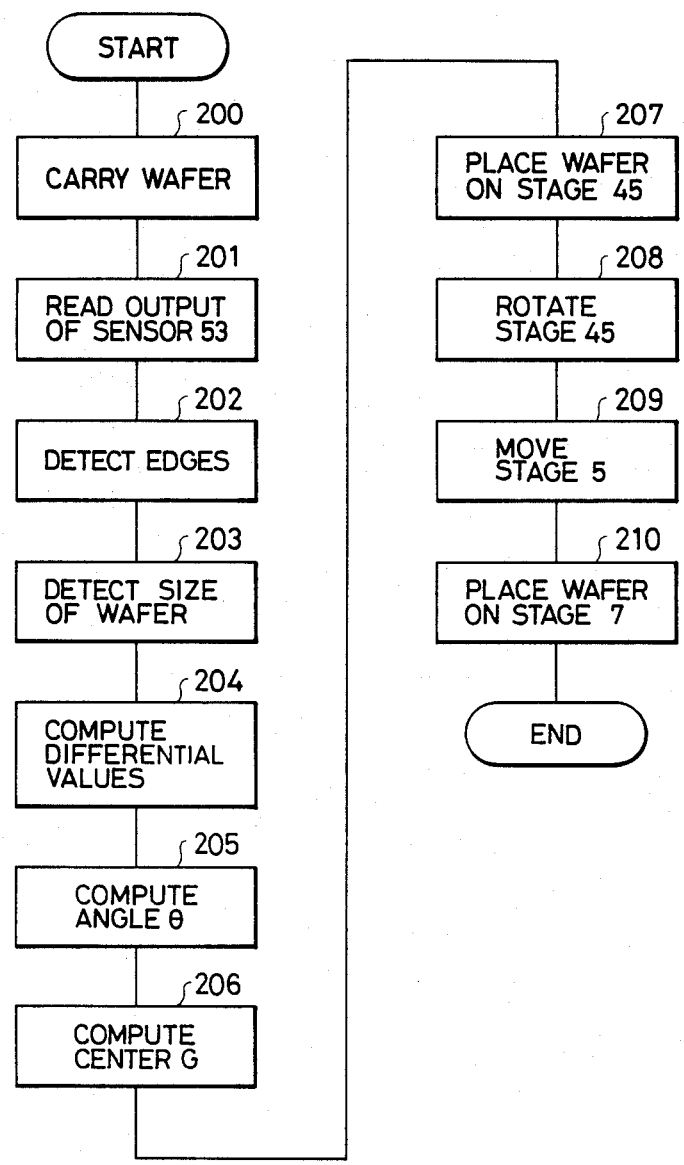
FIG. 11 is a flow chart indicating a pre-alignment procedure.

In the apparatus of the present invention, the alignment operation is controlled by the microcomputer 23a. In the following description reference will be made to a flow chart shown in FIG. 11 for explaining the pre-alignment procedure. At first, in step 200, the microcomputer 23a activates the arm 42 to extract a wafer 100' from the wafer cassette by vacuum suction. The wafer 100' is then moved in the direction of arrow F5 for transfer to the stage 45. In the course of this movement, step 201 is executed whereby the output signals of the line sensor 53, representing the image on the wafer 100', are read after A/D conversion. The image signals thus obtained are subjected to data processing in the microcomputer 23a to determine the wafer size, and the position of the center of the wafer or of the orientation flat of the wafer. As shown in FIG. 6A, the light from the light source 55 is reflected by the wafer 100' during the movement thereof in direction F5, is then reduced in size by the optical system 54 and guided to the line sensor 53. In this manner the surface of the wafer 100' is scanned as represented by vertical lines in FIG. 7, and corresponding image signals are produced from the line sensor 53.

Figure 8:
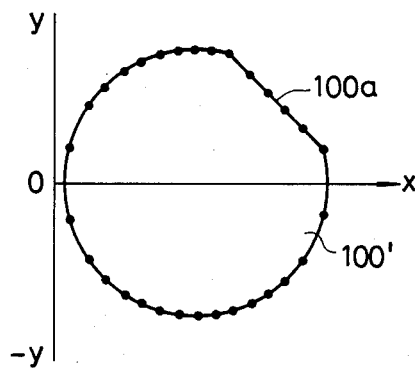
FIG. 8 is a schematic view showing edge dots on a wafer.

Step 202 detects, from the image signals, points corresponding to the edge of the wafer 100' as shown in FIG. 8, wherein the x-axis represents the amount of movement of the arm 42 while the y-axis corresponds to the positions of plural photodiodes. Said points are determined from the contrast between the wafer 100' and the background. Succeeding step 203 detects the wafer size, which is determined as the maximum of the distance the in Y-direction of two edge points shown in FIG. 8.

Figure 9:
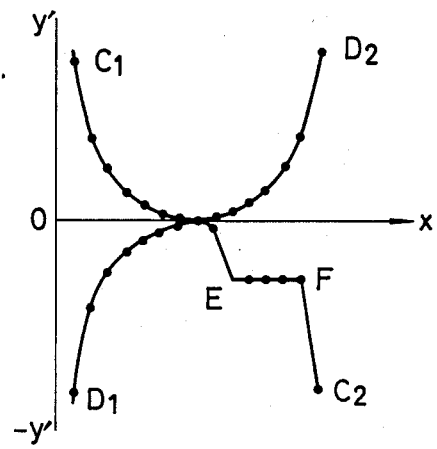
FIG. 9 is a chart showing a change in data of FIG. 8.

Then step 204 calculates the rate of variation, slope or differential, of the lines connecting the points shown in FIG. 8, thus obtaining the result shown in FIG. 9, wherein the y'-axis represents the rate of variation. A line C1–C2 represents the rate of variation of the upper line in FIG. 8, and a line D1–D2 represents the rate of variation of the lower line in FIG. 8.

In case the orientation flat 100a of the wafer 100' is not parallel to the y-axis or the the direction of array of the line sensor 53, as shown in FIG. 8, the rate of variation remains constant in a portion corresponding to the orientation flat, as exemplified by line E-F in FIG. 9. Therefore, the orientation flat 100a is identified as parallel to the y-axis if there is no such portion in which the rate of variation is constant, and, if otherwise, the orientation flat 100a is identified as not parallel to the y-axis. Also the position of the orientation flat 100a, i.e. above or below the x-axis, can be determined from whether such portion appears in the line C1–C2 or D1–D2.

Figure 10:
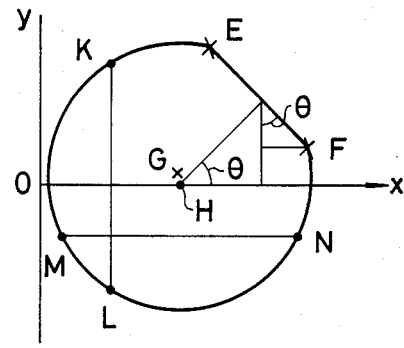
FIG. 10 is a chart showing an example of data processing for a wafer.

Step 205 determines, in case the orientation flat 100a is not parallel to the y-axis, the direction thereof or the angle thereof to the x-axis. Referring to FIG. 10, angle θ between the x-axis and a vertical line to the orientation flat, passing through a temporary center H, determined in advance on the x-axis, is represented by:

$$\theta = \tan^{-1} \frac{xF - xE}{yE - yF} \quad (1)$$

wherein (xE, yE) and (xF, yF) are coordinates of end points E, F of the orientation flat, as shown in FIG. 10. The direction of the orientation flat can be determined from this equation.

Next step 206 calculates the position of center G of the wafer 100'. Two lines K–L, M–N, respectively parallel to the y- and x-axis are assumed on the wafer 100' but outside the orientation flat 100a, with coordinates K(xK, yK), L(xL, yL), M(xM, yM) and N(xN, yN). The coordinates (xG, yG) of the center G of the wafer 100' is represented by:

$$xG = \frac{xN + xM}{2} \quad (2)$$

$$yG = \frac{yK + yL}{2} \quad (3)$$

The distance between center G and the aforementioned temporary center H is determined by:

$$Dx = xG - xH \quad (4)$$

$$Dy = yG - yH \quad (5)$$

wherein (xH, yH) are the coordinates of temporary center H, wehrein yH=0. Step 207 causes the arm 42 to load the wafer 100 on the stage 45. Step 208 rotates the stage 45 supporting the wafer 100' by the angle θ calculated in step 205, whereby the rotational aberration of the wafer 100' to the apparatus at the loading onto the stage 7 by the arm 42 is practically cancelled. Step 209 moves the X-Y stage to the position C shown in FIG. 2, and step 210 causes the arm 42 to load the wafer 100' on the stage 7. The above-mentioned values Dx, Dy are used as correction values in the displacement of the stage 7 from the position C shown in FIG. 2 in step 209, prior to the loading of the wafer 100 from the arm 42 to stage 7. More specifically, the stage 7 is displaced from the position C in such a manner that the center of stage coincides with the point G, whereby the center G of the wafer 100' coincides with the center of stage 7.

Figure 16:
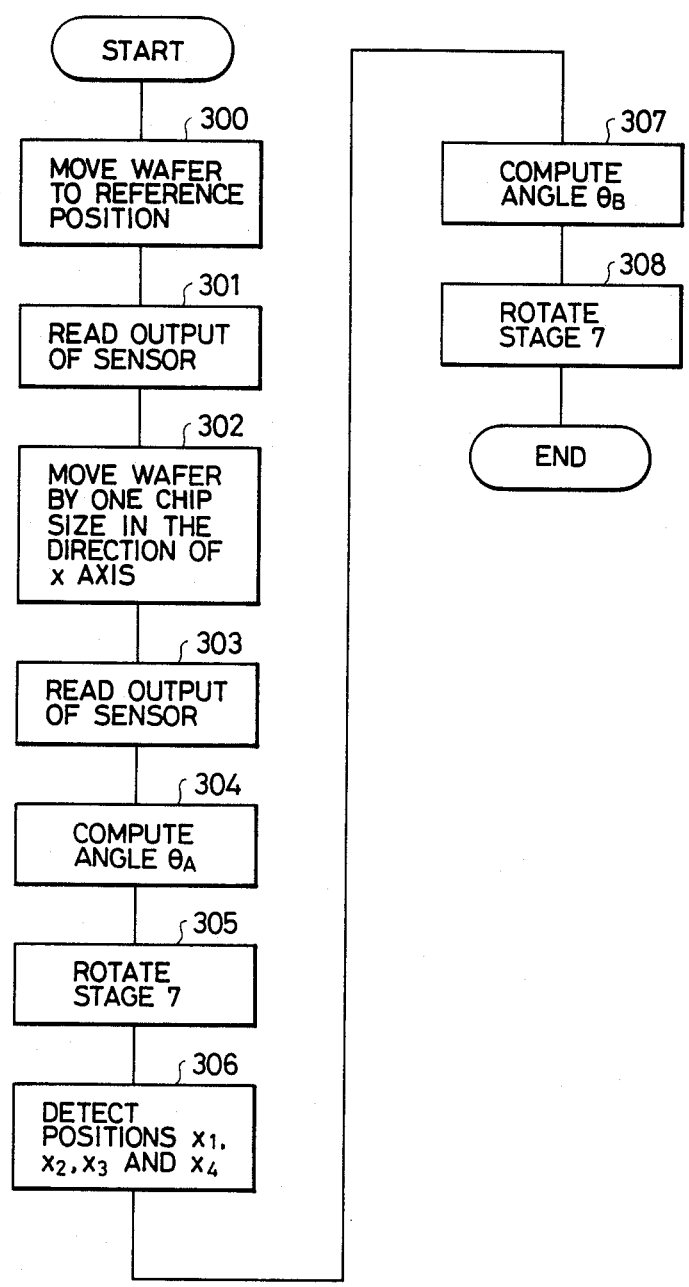
FIG. 16 is a flow chart showing a fine alignment procedure.

Now reference is made to FIG. 16 for explaining the fine alignment procedure in the apparatus of the present invention.

At the loading of the wafer from the arm 42 to the stage 7, plural pins are temporarily pushed out from stage 7 to lift the wafer 100' from the arm 42. In this state the arm 42 is extracted, and pins are retracted to place the wafer 100' on the stage 7. For conducting this operation, the front end of the arm 42 is square U-shaped.

The pattern on the wafer 100' placed on the stage 7 is determined, through the optical system 61, by the line sensor 13. The corresponding output signals from line sensor 13 are supplied, after A/D conversion, to the microcomputer 23a for fine alignment.

At first, in step 300, the microcomputer 23a drives the stage 5 in such a manner that the center G of the wafer 100' approximately coincides with a reference position of the apparatus.

Figure 12:
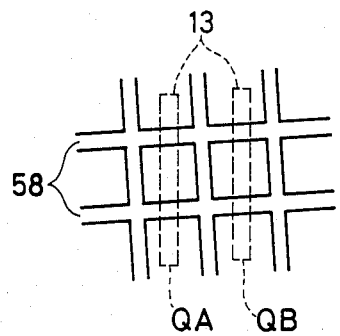
FIG. 12 is a schematic view showing the relationship between streets on a wafer and a line sensor.
Figure 13:
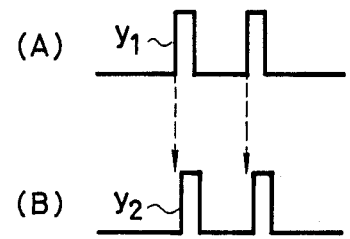
FIG. 13 is a chart showing the wave form of an output signal of a line sensor positioned on a street shown in FIG. 12.

Output signals of the line sensor 13 are read in step 301. As an example, reading an area QA in FIG. 12 provides image data as shown in FIG. 13(A). So-called streets 58, which are unexposed areas between the chips on the wafer, have higher reflectance and give rise to signal level changes as shown in FIG. 13(A). When the wafer 100' is shifted, in step 302, by one chip size as represented by area QB, the edges of the output signals of the line sensor 13 are slightly shifted as shown in FIG. 13(B), since the streets 58 and the line sensor 13 are not necessarily orthogonal. Step 303 reads the output of sensor 13.

Step 304 calculates the angle θA. The inclination angle θA of the street 58 to the line sensor 13 is given by:

$$\theta A = \tan^{-1} \frac{y2 - y1}{cx} \tag{6}$$

wherein y1, y2 are edge positions and cx is the chip size. Step 305 rotates the wafer 100' by angle θA by means of the stage 7.

Figure 14:
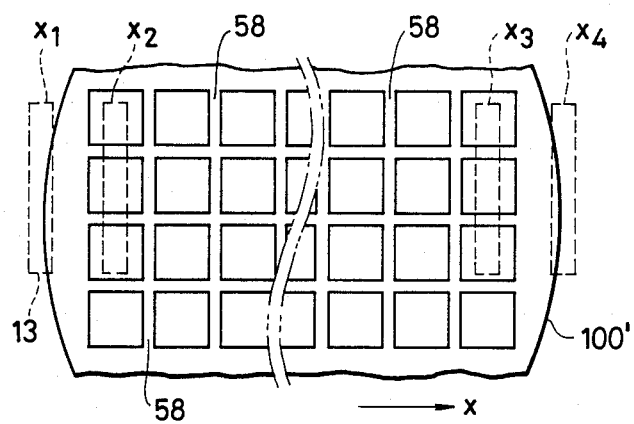
FIG. 14 is a schematic view showing the relationship between streets on a wafer and a line sensor.

Then step 306 moves the wafer 100' at a pitch corresponding to the chip size in the positive x-direction, with respect to the line sensor 13 as shown in FIG. 14. There is therefore determined a position $x_1$, at which the output of the line sensor 13 does not show the distribution shown in FIG. 13, or at which a street 58 cannot be found, and a position $x_2$ which is inside the position $x_1$ by one chip size. This is defined as the end position in the positive x-direction. Similarly the wafer 100' is stepwise moved by one chip size in the negative x-direction, and there are determined a position $x_4$ at which the street 58 cannot be found, and an end position $x_3$ which is inside position $x_4$ by one chip size.

Figure 15:
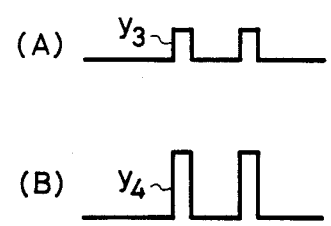
FIG. 15 is a chart showing the wave form of an output signal of a line sensor positioned on a street shown in FIG. 14.

Step 307 calculates an inclination correcting angle θB between the wafer 100' and the line sensor 13, which is determined by:

$$\theta B = \tan^{-1} \frac{y3 - y2}{x3 - x2} \tag{7}$$

wherein y2 or y3 is the edge position of a signal corresponding to a street when the line sensor 13 is positioned at x2 or x3, as shown in FIG. 15(A) or 15(B). Step 308 rotates the wafer 100' by correcting angle θB to complete the fine alignment.

Figure 17:
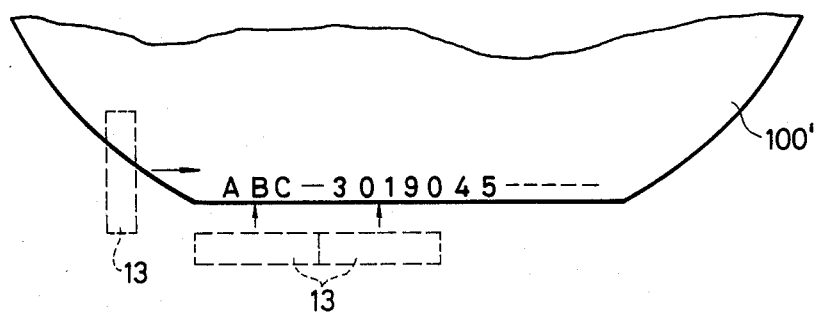
FIG. 17 is a plan view showing a principle of encoded data reading.

After the completion of the fine alignment, a code, for example of SEMI standard, or a bar code, provided in the vicinity of the orientation flat 100a, is read by the line sensor 13 as shown in FIG. 17, while the wafer 100' is moved by the stage 7 in either direction indicated by the arrows, and the obtained information is used for wafer administration.

Subsequently there is searched a first chip which is to be subjected to inspection or further working.

Figure 18:
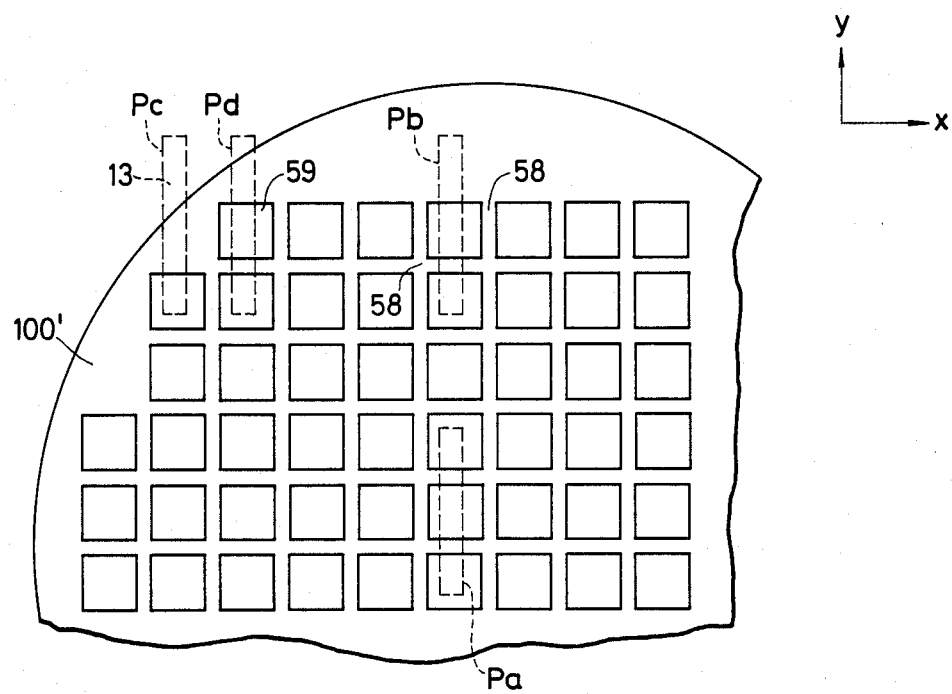
FIG. 18 is a schematic view showing a principle of first chip retrieval.

At first, as shown in FIG. 18, the wafer 100' is moved to a position Pa at which the central portion of the wafer in the X-direction can be viewed by the line sensor 13. Then the wafer is stepwise moved, by one chip size at a time, in the negative-y-direction to find a position Pb where two streets 58 cannot be found simultaneously.

Then the wafer 100' is stepwise moved, by one chip size at a time, in the x-direction to find a position Pc where no street can be found. The first chip 59 is present at a position Pd which is in front of position Pc by one chip size. FIG. 19(A) shows the output signal of the line sensor 13 when it is located at the position Pc, and the wafer is so adjusted in position that the street 58 coincides with an original poing $y_0$ for alignment on the line sensor 13, as shown in FIG. 19(B).

The y-address of the stage 7 in this state becomes the original point on the y-axis for alignment. Subsequently the wafer 100' is moved, as shown in FIG. 20, from e to f where the line sensor is positioned on a street 58, whereby the output of the line sensor varies from a state shown in FIG. 21(A) to a state in FIG. 21 (B). The address $x_0$ of the x-axis of the stage in this state becomes the original point on the x-axis for alignment. The alignment procedure for the wafer 100' is thus completed.

Thereafter the chips on wafer 100' are subjected, on the stage 7, to wafer inspection and further working.

The foregoing explanation of fine alignment has been limited to the right-hand inspection unit, but similar procedure and structure are applicable also to the left-hand inspection unit. Also the alignment conducted on the stage 45 may also be achieved on the stage 7 or 5 and 15 or 17.

Figure 22:
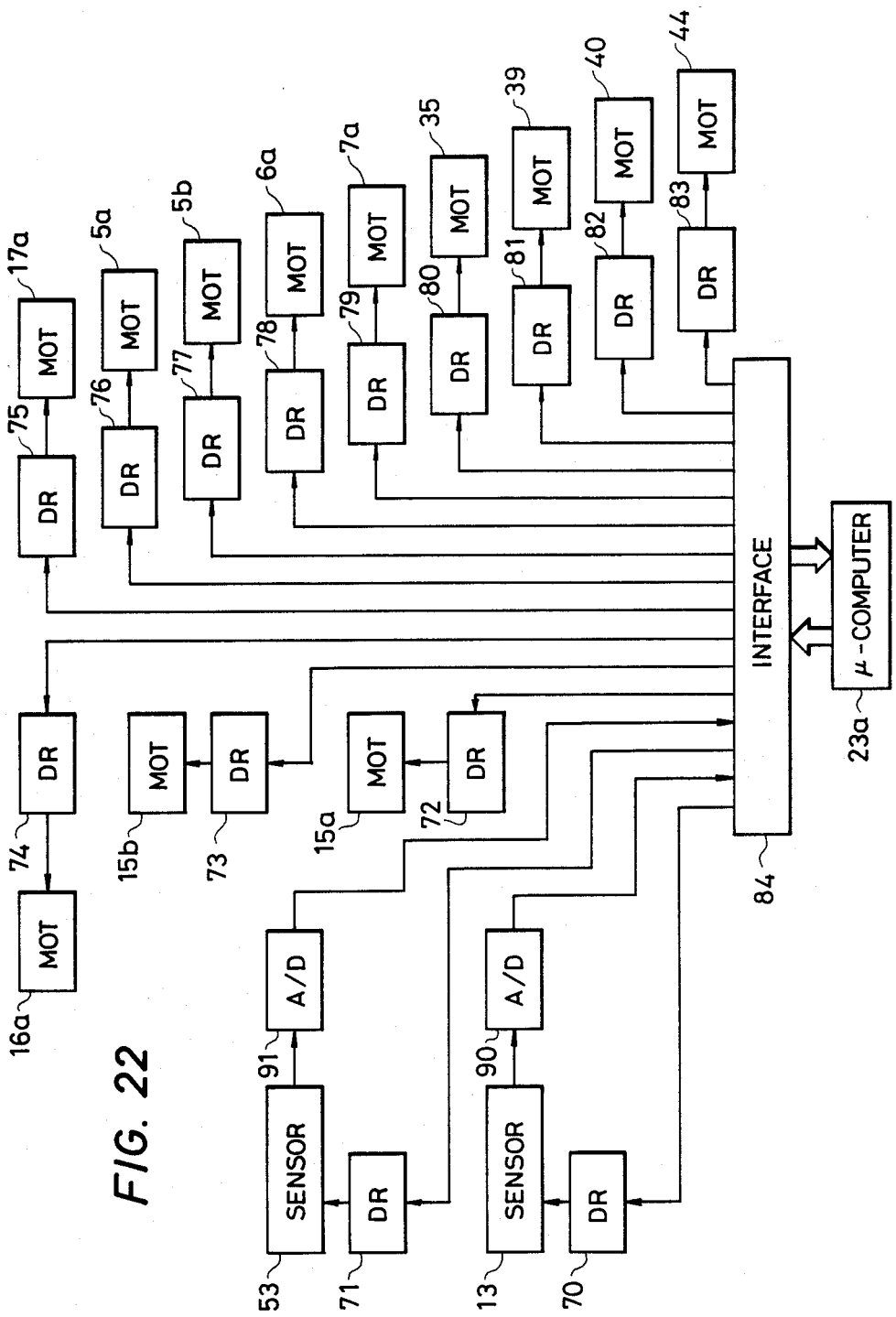
FIG. 22 is a block diagram showing a control system for use in the apparatus of the present invention.

As shown in FIG. 22, the microcomputer 23a controls the function of the above-explained apparatus through an interface 84. There are also provided a driver 70 for driving the line sensor 13; and A/D converter 90 for A/D conversion of the output of line sensor 13; a driver 71 for driving the line sensor 53; and A/D converter 91 for A/D conversion of the output of line sensor 53; a driver 72 for driving a motor 15a for moving the X-Y stage 15 in the X-direction; a driver 73 for driving a motor 15b for moving the X-Y stage 15 in the Y-direction; a driver 74 for driving a motor 16a for moving the Z-stage 16 in the Z-direction; a driver 75 for driving a motor 17a for rotating the θ-rotation stage 17; a driver 76 for driving a motor 5a for moving the X-Y stage 5 in the X-direction; a driver 77 for driving a motor 5b for moving the X-Y stage 5 in the Y-direction; a driver 78 for driving a motor 6a for moving the Z-stage 6 in the Z-direction; a driver 79 for driving a motor 7a for rotating the θ-rotation stage 7; and drivers 80, 81, 82, 83 for respectively driving the motors 35, 39, 40, 44. The microcomputer 23a controls said drivers 70–83 through the interface 84 to cause the apparatus to function according to the flow charts shown in FIGS. 4, 11 and 16.

What is claimed is:

1. Apparatus comprising:
   (a) inspection means for inspecting a wafer, said inspection means having support means for supporting said wafer while the wafer is inspected;
   (b) transport means for transporting said wafer to said support means;
   (c) scanning means for scanning said wafer photoelectrically and for generating output signals during said transporting of said wafer by said transport means; and
   (d) alignment means for aligning said wafer with respect to said apparatus in response to said output signals generated by said scanning means during said transporting of said wafer by said transport means.

2. Apparatus according to claim 1, wherein said scanning means comprises a linear image sensor.

3. Apparatus according to claim 2, wherein said image sensor comprises a plurality of photoelectric conversion elements disposed along a line.

4. Apparatus according to claim 1, wherein said transport means transports said wafer from a first position to a second position along a predetermined path, and wherein said scanning means detects a light intensity distribution at a predetermined region that extends substantially perpendicular to said path.

5. Apparatus according to claim 4, wherein said alignment means aligns said wafer with respect to said apparatus after the wafer has been transported to said second position by the transport means.

6. Apparatus according to claim 4, wherein said transport means has means for mounting the wafer thereon, wherein said apparatus includes means for determining the orientation of an orientation flat of the wafer mounted on the mounting means based on output signals from said scanning means, and wherein said alignment means rotates the wafer in accordance with the orientation determined by said determining means.

7. Apparatus according to claim 6, wherein said apparatus includes another mounting means located at said second position, wherein said determining means also determines the position of the center of the wafer on the first-mentioned mounting means, and wherein said transport means mounts the wafer on said another mounting means based on the determining of the position of the center of the wafer so that the center of the wafer is substantially coincident with a predetermined position of said another mounting means.

8. Apparatus according to claim 4, wherein said scanning means is formed so that the length of said predetermined region is greater than a corresponding dimension of said wafer.

9. Apparatus comprising:
   (a) support means for supporting a wafer;
   (b) transport means for transporting said wafer to said support means;
   (c) scanning means for scanning said wafer photoelectrically and for generating output signals during said transporting of said wafer by said transport means; and
   (d) alignment means for aligning said wafer with respect to said apparatus in response to said output signals generated by said scanning means during said transporting of said wafer by said transport means.

10. Apparatus comprising:
    (a) operating means having support means for supporting a substrate;
    (b) transporting means for transporting said substrate to said support means in order to permit said operating means to operate upon said substrate;
    (c) scanning means for scanning said substrate photoelectrically and for generating output signals during said transporting of said substrate by said transport means; and
    (d) alignment means for causing said support means to align said substrate supported by said support means with respect to said operating means in response to said output signals operated by said scanning means during said transporting of said substrate by said transport means;
    said operating means operating upon said substrate in response to the completion of said aligning by said alignment means.

11. Apparatus according to claim 10, wherein said scanning means comprises a linear image sensor.

12. Apparatus according to claim 11, wherein said linear image sensor has a light receiving surface which is extended along a predetermined direction, and wherein the length of said light receiving surface along said predetermined direction is greater than a corresponding dimension of said substrate.

13. Apparatus comprising:
    (a) operating means having means for supporting a substrate;
    (b) transport means for transporting said substrate from a predetermined position to said support means in order to permit said operating means to operate upon said substrate;
    (c) light detecting means for detecting light intensity distribution on a predetermined region which is positioned between said predetermined position and said support means, said light detecting means generating output signals indicative of light intensity distribution of said predetermined region; and
    (d) alignment means for causing said support means to align said substrate supported by said support means with respect to said operating means in response to said output signals which are generated by said light detecting means during said transporting of said substrate by said transport means;
    said operating means operating upon said substrate in response to the completion of said aligning by said alignment means.

14. Apparatus according to claim 13, wherein said light detecting means is formed so that the length of said predetermined region is greater than a corresponding dimension of said substrate.

* * * * *